US012707924B2

(12) United States Patent
Tong et al.

(10) Patent No.: US 12,707,924 B2
(45) Date of Patent: Aug. 11, 2026

(54) SYSTEMS AND METHODS FOR DETECTING A SUBSTRATE IN A CHAMBER OF A SUBSTRATE PROCESSING SYSTEM

(71) Applicant: Applied Materials, Inc., Santa Clara, CA (US)

(72) Inventors: Mingle Tong, San Jose, CA (US); Siqing Lu, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 288 days.

(21) Appl. No.: 18/377,028

(22) Filed: Oct. 5, 2023

(65) Prior Publication Data

US 2025/0118580 A1 Apr. 10, 2025

(51) Int. Cl.
*H10P 72/00* (2026.01)
*H10P 72/30* (2026.01)

(52) U.S. Cl.
CPC .......... *H10P 72/0606* (2026.01); *H10P 72/30* (2026.01)

(58) Field of Classification Search
CPC ........................ H01L 21/67259; H01L 21/677
See application file for complete search history.

(56) References Cited

U.S. PATENT DOCUMENTS 4,819,167 A 4/1989 Cheng et al.
5,563,798 A 10/1996 Berken et al.
2008/0316505 A1 12/2008 Graf et al.
2009/0192633 A1* 7/2009 Schauer ............ H01L 21/67259 700/59
2011/0248190 A1* 10/2011 Tanaka .................. H01L 21/681 414/816
2013/0135605 A1 5/2013 Wada
2014/0264059 A1 9/2014 Baluja et al.
2022/0236198 A1 7/2022 Chou
2023/0184540 A1* 6/2023 Guo ...................... H01L 21/681 356/237.5

FOREIGN PATENT DOCUMENTS

KR 10-2008-0070887 A 8/2008

OTHER PUBLICATIONS

Chouichi, Aabir, et al. "Chamber-to-chamber discrepancy detection in semiconductor manufacturing." IEEE Transactions on Semiconductor Manufacturing 33.1 (2020): 86-95. (Year: 2020).*
PCT International Search Report and Written Opinion for PCT/US2024/041876 dated Nov. 27, 2024.

* cited by examiner

*Primary Examiner* — Emmett K. Walsh
(74) *Attorney, Agent, or Firm* — Moser Taboada

(57) ABSTRACT

Methods, systems, and apparatus are provided for detecting a substrate in a chamber of a substrate processing system. In some embodiments, the system may include a sensor system comprising: a light source configured to generate light; a first light guide fixed relative to the light source and having a light input and a light output offset from the light input, the light input configured to receive light generated by the light source, wherein the first light guide guides the light between the light input and the light output so that the light output emits a light beam into a volume of the chamber; and a sensor configured to sense the light beam emitted from the light output.

20 Claims, 12 Drawing Sheets

13
11a
57
56
55
610,1002
616
25
51
52
11
11b
30
(R) 43
(θ) 44
53
54
14
15
19
29
34
49
47
23
28
10
14
31
46
50
15
15
18
21
27
26

Y
66
65
X6
X7
64
X5
X4
X3
X2
X1
15
74
31
32

SYSTEMS AND METHODS FOR DETECTING A SUBSTRATE IN A CHAMBER OF A SUBSTRATE PROCESSING SYSTEM

FIELD

Embodiments of the present disclosure generally relate to systems and methods for detecting a substrate in a chamber of a substrate processing system, and more particularly to an optical sensor system and method using a light guide for obtaining substrate position data.

BACKGROUND

Semiconductors are often manufactured in substrate processing systems which involve placement of substrates in chambers "load lock" chambers and a variety of substrate processing chambers, such as deposition chambers, thermal processing chambers, etching chambers, plasma chambers. In some semiconductor processing systems, substrates are supplied to the load lock chamber from one or more front opening unified pods (FOUPs) using robotic arms or robot arms. Processing of substrates such as producing patterned material on a substrate entails controlled methods for deposition and removal of exposed material. Before substrate processing is performed, the substrates are precisely placed in the substrate processing chambers.

Due to several reasons, such as variations in substrate placement in a FOUP, variations in substrate placement in processing chambers, and inconsistencies in repeatability of wafer transfer from robot arms, substrates may not be exactly picked and placed similarly. Therefore, there is a possibility that different substrates are not placed exactly at the same position in a process chamber, which can affect production yields.

Traditionally, detecting a center (or an edge) of a generally round substrate (e.g., a silicon wafer) involves using a series of emitters, sensors, and reflectors in a processing chamber or load lock chamber, where the wafer blocks the path of light emitted from some of the emitters. However, in some instances, the positioning of the emitters and sensors may be located on movable portions of the chamber, such as a lid. As a result, movement of the emitter and sensor, such as when the lid is opened, may create a need to recalibrate the emitter, which can reduce throughput due to increased downtime of the chamber. Also, the location and spacing of the emitters and/or sensors are often fixed and based on a specific size of the wafer being processed in the chamber, which can limit the use of the chamber to specific sizes of wafers.

In some chambers, the configuration of chamber components may restrict the location of emitters, sensors, and reflectors to locations that may compromise the accuracy of the measurements. For example, in some chambers, an emitter and sensor may be located in a lid of a chamber and oriented in a vertically inclined orientation to scan an edge of a substrate, which can result in inaccuracy if the substrate is not horizontal, e.g., if a robot arm supporting the substrate droops.

Thus, improved substrate positioning apparatus and methods are desired that avoid recalibration, expand usage of the chambers to multiple size substrates, and improve accuracy of the measurements.

SUMMARY

Methods, systems, and apparatus for detecting the center of a substrate in a chamber of a substrate processing system are provided herein. In some embodiments, a substrate processing system includes: a chamber having an interior volume; and a sensor system coupled to the chamber, the sensor system comprising: a light source configured to generate light; a first light guide fixed relative to the light source and having a light input and a light output offset from the light input, the light input configured to receive light generated by the light source, wherein the first light guide guides the light between the light input and the light output so that the light output emits a light beam into the interior volume of the chamber; and a sensor configured to sense the light beam emitted from the light output.

In some embodiments, a sensor system for detecting a substrate in a chamber of a substrate processing system, the sensor system comprising: a light source configured to generate light; a first light guide fixed relative to the light source and having a light input and a light output offset from the light input, the light input configured to receive light generated by the light source, wherein the first light guide guides the light between the light input and the light output so that the light output emits a light beam into a volume of the chamber; and a sensor configured to sense the light beam emitted from the light output.

In some embodiments, a method for detecting a substrate in a chamber of a substrate processing system, the method comprising: generating an array of light beams within the chamber transverse to a path of movement of the substrate within the chamber, wherein the array of light beams is generated by one or more sensor system comprising: a light source configured to generate light; a first light guide fixed relative to the light source and having a light input and a light output offset from the light input, the light input configured to receive light generated by the light source, wherein the first light guide guides the light between the light input and the light output so that the light output emits a light beam into a volume of the chamber; and a sensor configured to sense the light beam emitted from the light output; moving the substrate along the path such that leading and trailing edges of the substrate trigger the sensor to thereby generate associated sensor outputs that represent positions associated with the light outputs along the path of movement; and determining a center of the substrate based on the sensor outputs.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
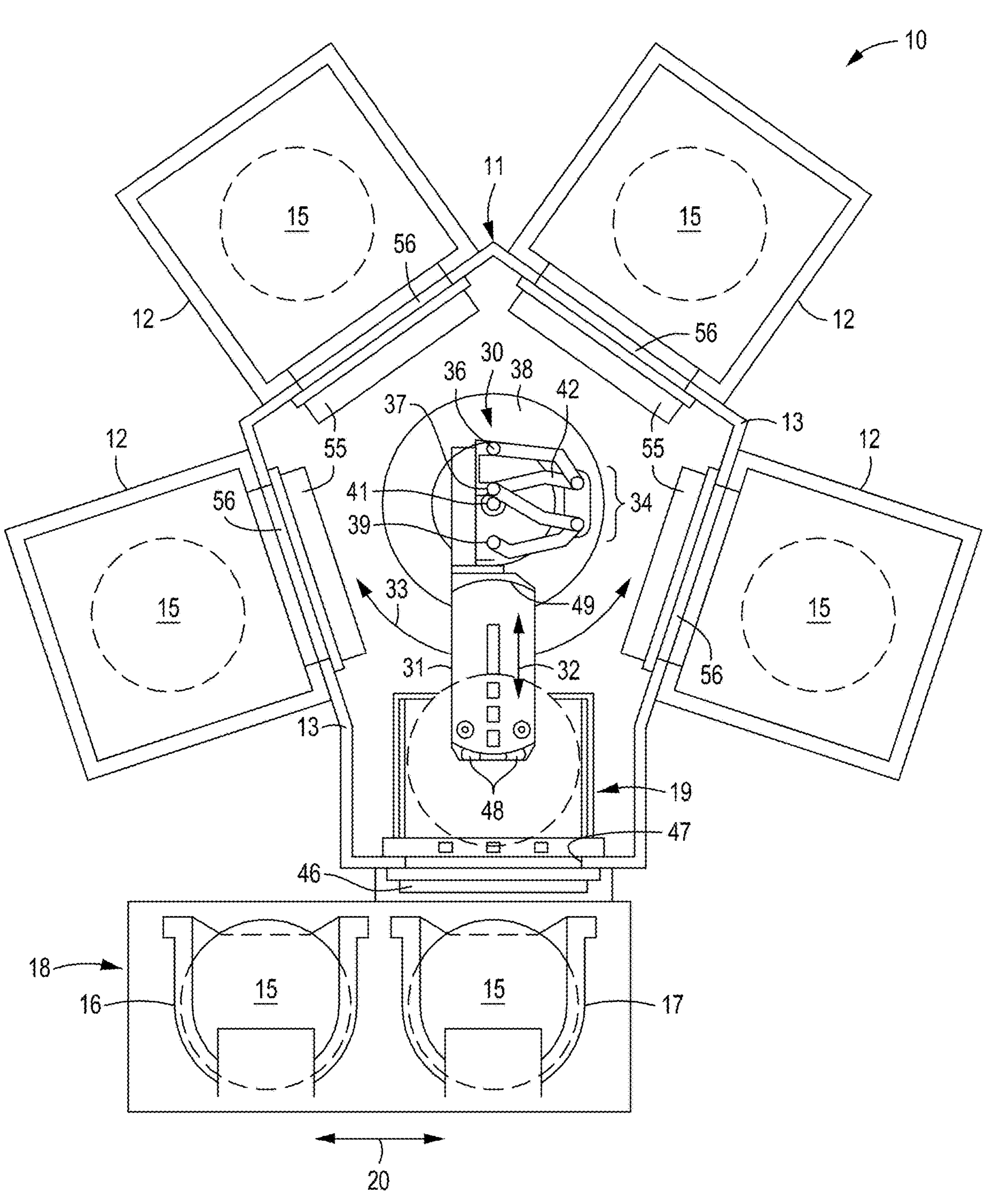
FIGS. 1 and 2, are respectively, a top plan view and a vertical sectional view of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of systems and methods for detecting the center of a substrate in a chamber of a substrate processing system are provided herein. In some embodiments, a sensor system may use a light source to generate light in a chamber along with a light guide to receive the light and direct light beams inside a chamber along a path to a sensor. The light beams may be detected by the sensor. Blocking and unblocking of the light beams by an edge of a moving substrate in the chamber may trigger recording of detected positions of the substrate in the chamber corresponding to the location of the light beam. The recorded positions can, in turn, be used to determine (e.g., calculate) the center of the substrate. The light guide can provide flexibility in locating the light source and/or the sensor even in instances where chamber geometry is complex or a direct view to an edge of a substrate not available due to lack of view port on the chamber body. Also, embodiments of systems and methods described herein are adaptable to measure multiple sizes of substrates by installing a suitable light guide for various sizes of substrates.

Figure 2:
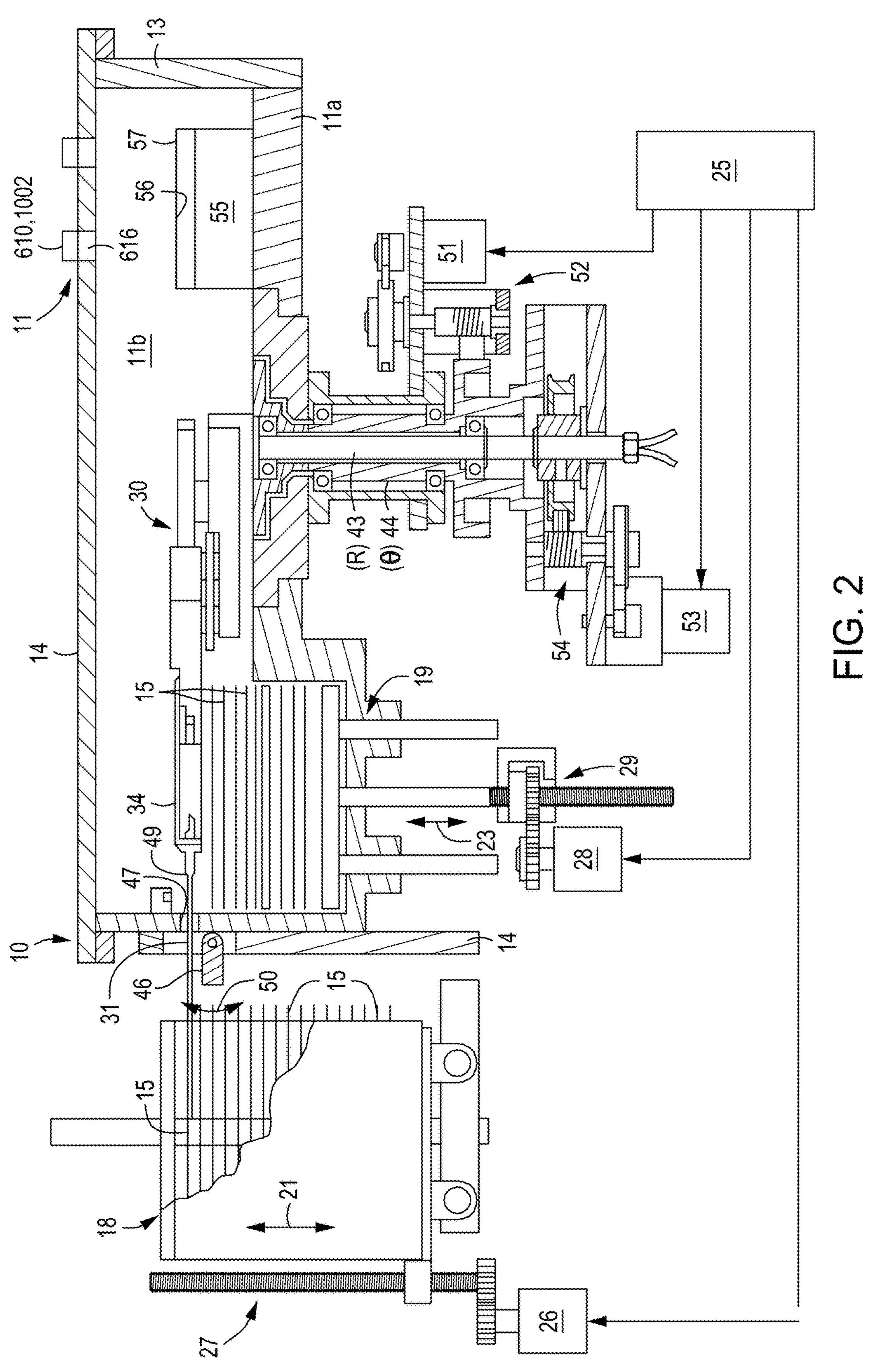

FIGS. 1 and 2 are, respectively, a top plan view and a vertical sectional view of a substrate processing system 10 in accordance with some embodiments of the present disclosure. In some embodiments, and as shown in FIGS. 1 and 2, the substrate processing system 10 may include an enclosed, generally vacuum load lock chamber 11 (also known as a transfer chamber) and one or more substrate processing chambers 12 mounted to the load lock chamber 11 on respective load lock chamber walls 13. The load lock chamber 11 may include a base 11*a,* chamber walls 13, and a lid 14 that may enclose a volume 11*b* of the load lock chamber 11. In some embodiments, substrates 15 may be contained in cassettes 16 and 17, which may be positioned on an external cassette elevator 18.

In some embodiments, and as indicated by arrows 20 (FIGS. 1) and 21 (FIG. 2), the external cassette elevator 18 may be indexable, horizontally and vertically. Internal storage elevator 19 may be vertically indexable along path 23. In some embodiments, and a shown in FIG. 2, the substrate processing system 10 may include an indexing vertical motion drive system that includes a stepper motor 26 configured to drive a lead screw drive 27 for reciprocally indexing the external cassette elevator 18 and stepper motor 28 configured to drive a lead screw drive 29 for reciprocally indexing the internal storage elevator 19. The stepper motors 26 and 28 may be controlled by a controller 25. The lead screw drives 27 and 29 may be used to position the external cassette elevator 18 and internal storage elevator 19 for loading and unloading substrates 15.

In some embodiments, and as shown in FIGS. 1 and 2, the substrate processing system 10 may include a robot 30 to transfer substrates 15 between the external cassette elevator 18 and the internal storage elevator 19, as well as between the internal storage elevator 19 and the substrate processing chambers 12. In some embodiments, and as shown in FIGS. 1 and 2, the robot 30 may include a substrate transfer blade 31 which is mounted for reversible linear translation along a path indicated in FIG. 1 by arrow 32 (radial "R" movement) and reversible rotation indicated by arrow 33 (angular "θ" movement).

In some embodiments, the robot 30 may include a four-bar link mechanism 34 which mounts the substrate transfer blade 31 at link ends 36 and 37. Opposite link ends 39 and 41 of the four-bar link mechanism 34 are mounted to platform 38. A concentric shaft drive mechanism effects R and θ movement. That is, in some embodiments, drive link 42 of the dual four-bar link mechanism 34 may be connected at end 41 thereof to one rotatable drive shaft 43 (FIG. 2), rotation of which causes the four-bar link mechanism 34 to extend and retract the substrate transfer blade 31 along the path indicated by arrow 32. A second concentric rotatable shaft 44 may mount and rotate the platform 38 and to impart reversible θ movement to the blade 31 along path 33. In some embodiments, and as shown in FIG. 2, a motor 51 may be provided to drive a cable and drum drive system 52 to rotate shaft 44, while a motor 53 may be provided to drive a cable and drum drive system 54 to rotate the rotatable drive shaft 43. In some embodiments, at least one of the motor 51 or 53 may be controlled by controller 25 to move the substrate transfer blade 31 to selected combinations of R and θ to permit extending the substrate transfer blade 31 into the cassette elevator 18 for loading and unloading substrates, extending the substrate transfer blade 31 into internal storage elevator 19 for unloading and loading substrates there, and pivotal orientation at and extension of the substrate transfer blade 31 into a selected substrate processing chamber 12 for loading and off-loading substrates 15 at a horizontal substrate support position illustrated in broken line in each of the substrate processing chambers 12 shown in FIG. 1.

In some embodiments, after a substrate 15 is loaded onto the internal storage elevator 19 from the external cassette elevator 18, a slit valve 46 may be closed over a slit valve opening 47 (FIG. 2) and single or multiple step processing can be applied to the substrate 15 in one or more of the substrate processing chambers 12 (e.g., without breaking vacuum). Alternatively, additional substrates 15 can be loaded into the internal storage elevator 19 while other substrates 15 are being processed in the substrate processing chambers 12, and the load lock chamber 11 returned to vacuum for unloading and reloading the substrate processing chambers 12.

A slit valve 46 may be pivotally mounted at slit valve opening 47 as indicated by arrow 50 in FIG. 2, for closing the slit valve opening 47 to vacuum-isolate the load lock chamber 11. Slit valves 55 may be mounted at slit valve openings 56 in FIG. 2 for closing the slit valve openings 56 to vacuum-isolate the substrate processing chambers 12. In some embodiments, the slit valve 46 and/or slit valves 55 may be opened and/or closed by an air cylinder-operated cam system under control of controller 25.

Referring further to FIGS. 1 and 2, in some embodiments, the end of the substrate transfer blade 31 may incorporates vacuum orifices 48-48 (FIG. 1) which permit the substrate transfer blade 31 to be used as pick for off-loading substrates 15 from the external cassette elevator 18 into the internal storage elevator and vice versa. In some embodiments, a pocket 49 in the substrate transfer blade 31 may hold one or more substrates 15 during transfer between the internal storage elevator 19 and the substrate processing chambers 12 and between the chambers. However, the individual substrates 15 are not positioned precisely the same within the respective cassettes 16 and 17 and are not positioned identically on the substrate transfer blade 31. Thus, after the substrate 15 has been off-loaded from a cassette 16 or 17, the precise location of the substrate 15 on the substrate transfer blade 31 may be provided to the controller 25 to adjust to the variable position of each substrate 15 and deposit the substrate 15 precisely in position within the internal storage elevator 19.

Figure 3:
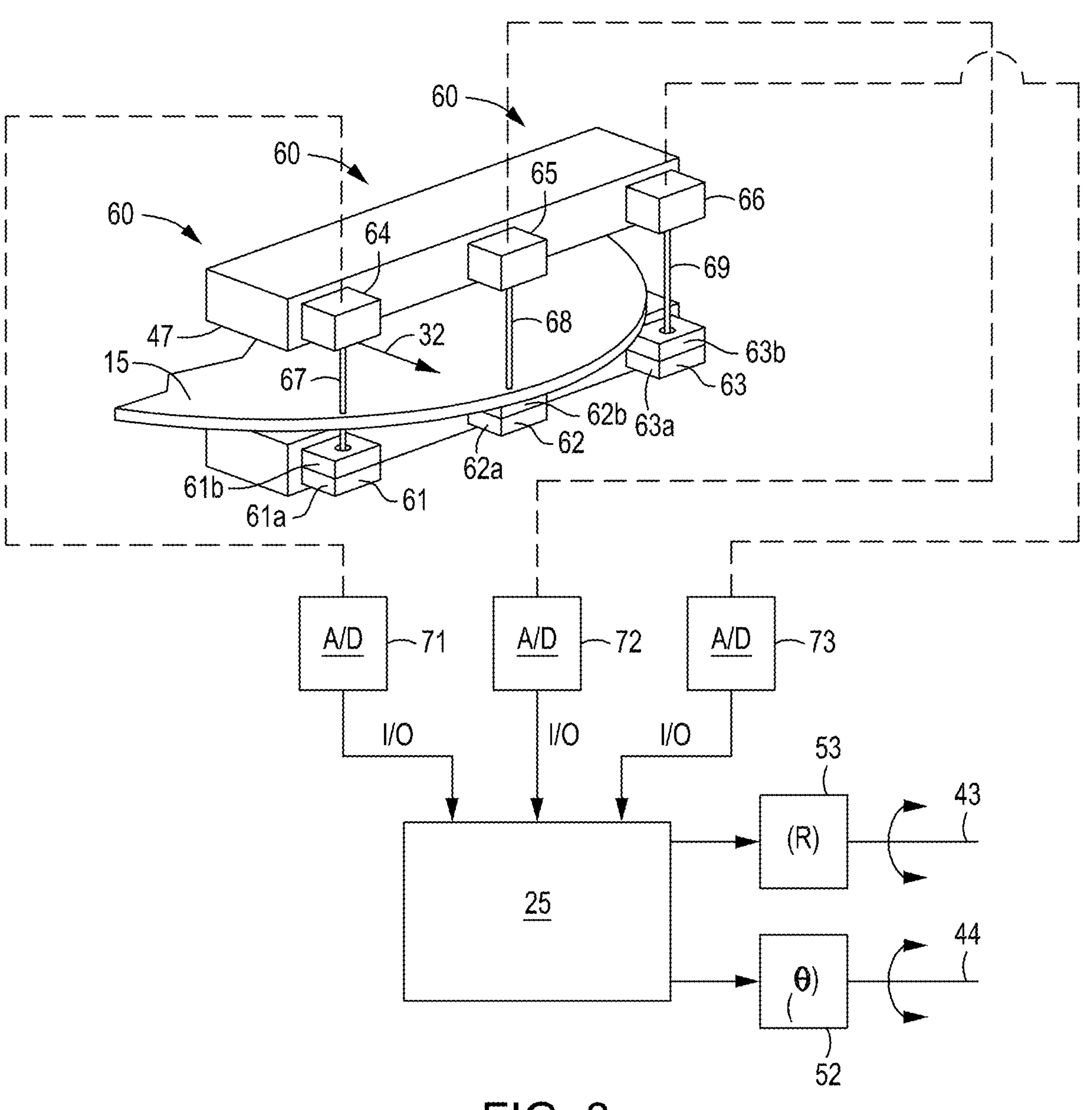
FIG. 3 shows an embodiment of a sensor system in accordance with some embodiments of the present disclosure.

In some embodiments, and as shown in FIG. 3, a sensor system 60 may provide substrate position data to enable the robot 30 to precisely position the substrate 15 in the internal storage elevator 19. In some embodiments and as shown in FIG. 3, the sensor system 60 may comprises a sensor (e.g., sensors 64, 65, and 66 are shown) mounted above the slit valve opening 47 along an axis that is perpendicular to the path indicated by arrow 32 of the substrate transfer blade 31, and an emitter (e.g., three emitters 61, 62, and 63 are shown) positioned below the slit valve opening 47. Each emitter 61, 62, 63 may be configured to emit a light beam (e.g., three light beams 67, 68, and 69 are shown) towards a corresponding sensor 64, 65, 66. In some embodiments, emitter 61 and sensor 64 comprise a first emitter/sensor pair, emitter 62 and sensor 65 comprise a second emitter/sensor pair, and emitter 63 and sensor 66 comprise a third emitter/sensor pair.

In some embodiments, a method of detecting a substrate (e.g. substrate 15) in a chamber (e.g., load lock chamber 11) of a substrate processing system (e.g., substrate processing system 10) may include generating an array of light beams (e.g., light beams 67, 68, and 69) within the chamber (e.g., along a common axis) transverse to a path of movement of the substrate within the chamber. In some embodiments, the array of light beams may be generated by one or more sensor systems (e.g., sensor systems 60). The method may also include moving the substrate along the path such that leading and trailing edges of the substrate trigger the sensor to thereby generate associated sensor outputs that represent positions associated with the light outputs along the path of movement. The method may also include determining a center of the substrate based on the sensor outputs.

In some embodiments, each sensors 64, 65, and 66 may be configured to sense the respective light beam 67, 68, and 69 emitted from the emitters 61, 62, and 63. Thus, when an edge of an object, such as the substrate 15, crosses a light beam 67, 68, 69, the respective sensor 64, 65, and 66 senses an absence of the light beam, which can trigger a sensor output signal to be recorded. The sensor output signal may correspond to the location of the emitter associated with the crossed light beam. The location of the emitter can be used to calculate the location of the center of the substrate 15 as described in greater detail below.

In some embodiments, the first, second, and third emitter/sensor pairs may be identically configured. For example, in some embodiments, the emitters 61, 62, and 63 may each include a light source 61*a*, 62*a*, 63*a* and a light guide 61*b*, 62*b*, 63*b*. The light sources 61*a*, 62*a*, and 63*a* may be configured to generate light in the load lock chamber 11 and the light guides 61*b*, 62*b*, and 63*b* may be fixed relative to the respective light sources 61*a*, 62*a*, and 63*a* and may have a light input and a light output offset from the light input. The light input may be configured to receive light generated by the light source. The light guides 61*b*, 62*b*, and 63*b* each may have an internal structure that internally reflects light between the light input and the light output. The light output of each light guide 61*b*, 62*b*, and 63*b* may emit respective light beams 67, 68, and 69.

In some embodiments, and as shown in FIG. 3, outputs from the sensors 64, 65, and 66 may be converted by associated analog-to-digital converters 71, 72, and 73 into digital signals. The digital signals may be applied as inputs to controller 25 for use in computing the center coordinate of the substrate 15 as it enters the load lock chamber 11, and for use in controlling the operation of the motor 53 and the motor 51, as well as the other drive motors, via appropriate conventional position feedback sensors, etc., to enable the required precise positioning operations of the robot 30, i.e., positioning by the robot 30 of the substrate 15 at the internal storage elevator 19. Details of the sensing and motor control circuitry are conventional and will be readily tailored by those of usual skill in the art to a particular system. Thus, such details are not discussed in depth here.

Figure 4:
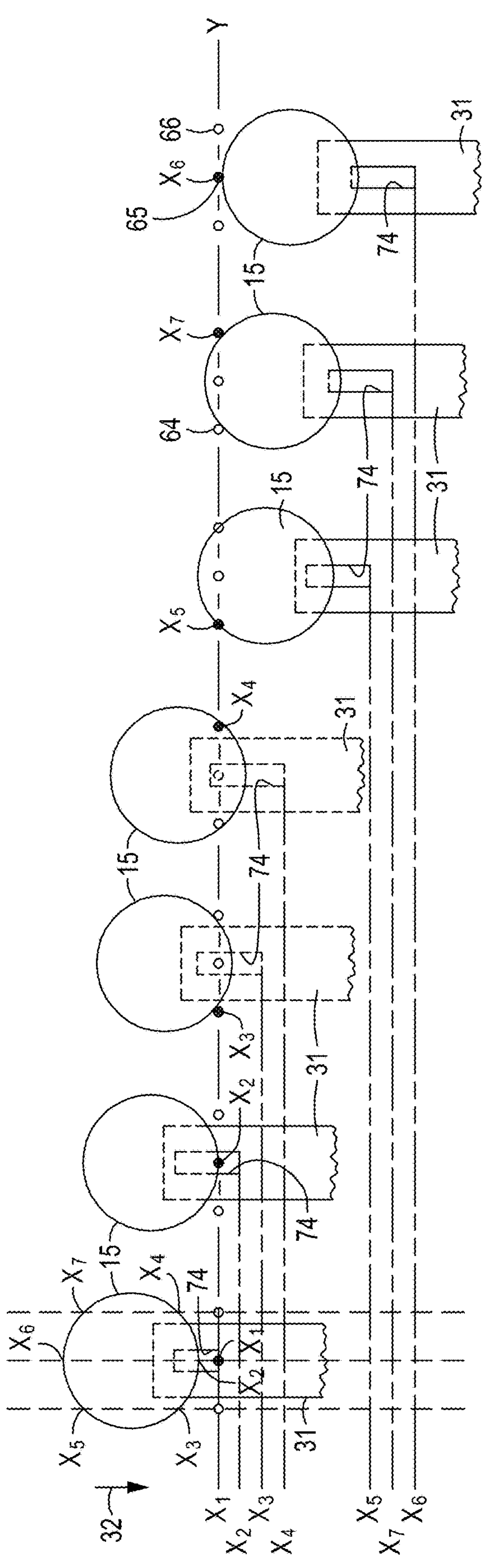
FIG. 4 shows movement of the substrate shown in FIG. 3 in the substrate processing system shown in FIGS. 1 and 2.

As shown in FIG. 4, an x,y coordinate system may be conveniently defined by the sensor systems 60 shown in FIG. 3 and arrow 32. The origin (0,0) of the x,y coordinate system may be defined by the position of a light output of the center emitter 62. The x axis may be the path of the substrate transfer blade 31; the y axis may be a center line through light outputs of light guides 61*b*, 62*b*, and 63*b*. In some embodiments, because of the non-linear relationship between motor steps and blade position, a look-up table may be provided in a memory of the controller 25 to provide the x coordinate associated with each step.

Figure 5:
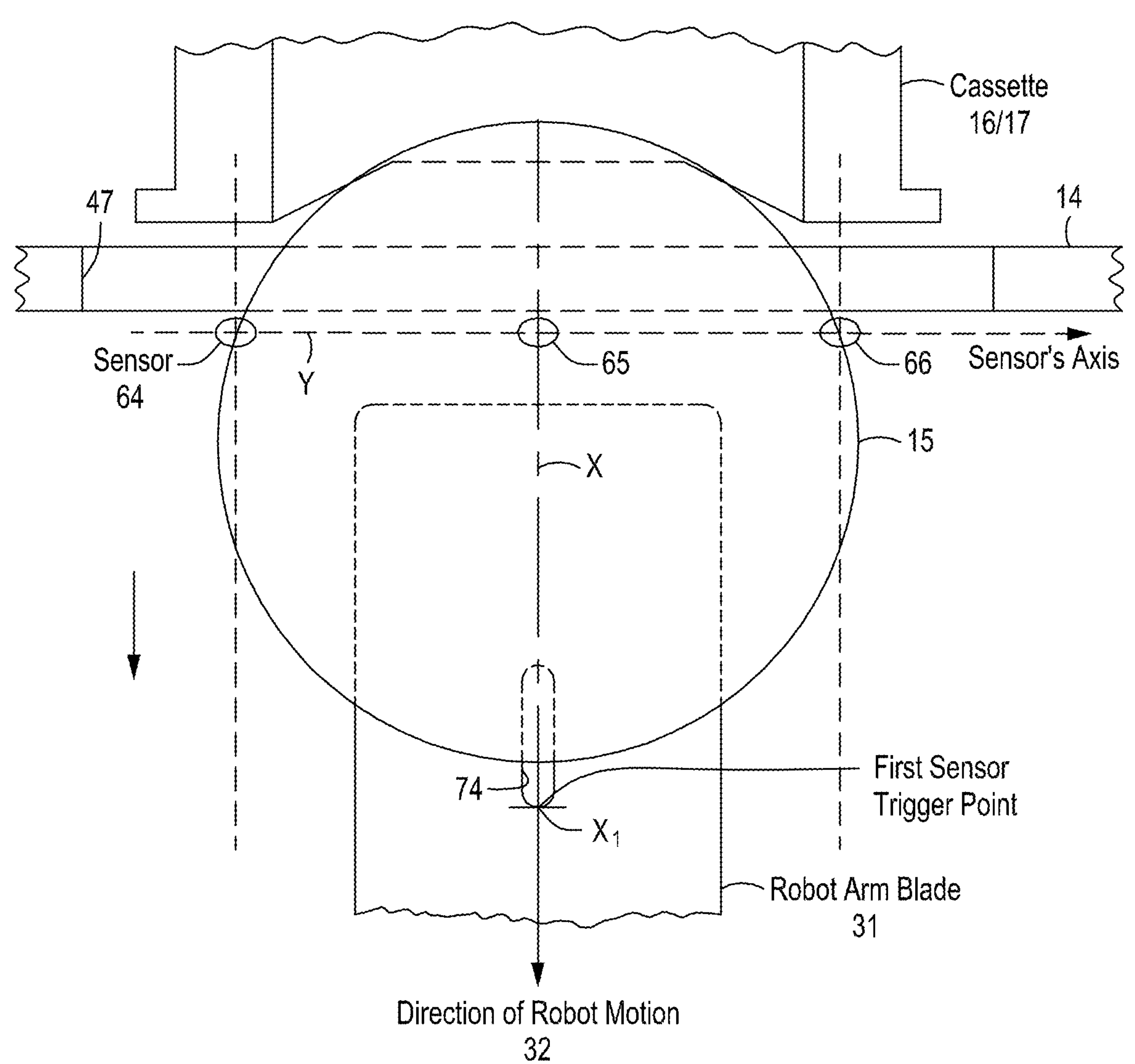
FIG. 5 is an enlarged top plan view of a portion of the substrate processing system shown in FIGS. 1 and 2.
Figure 6:
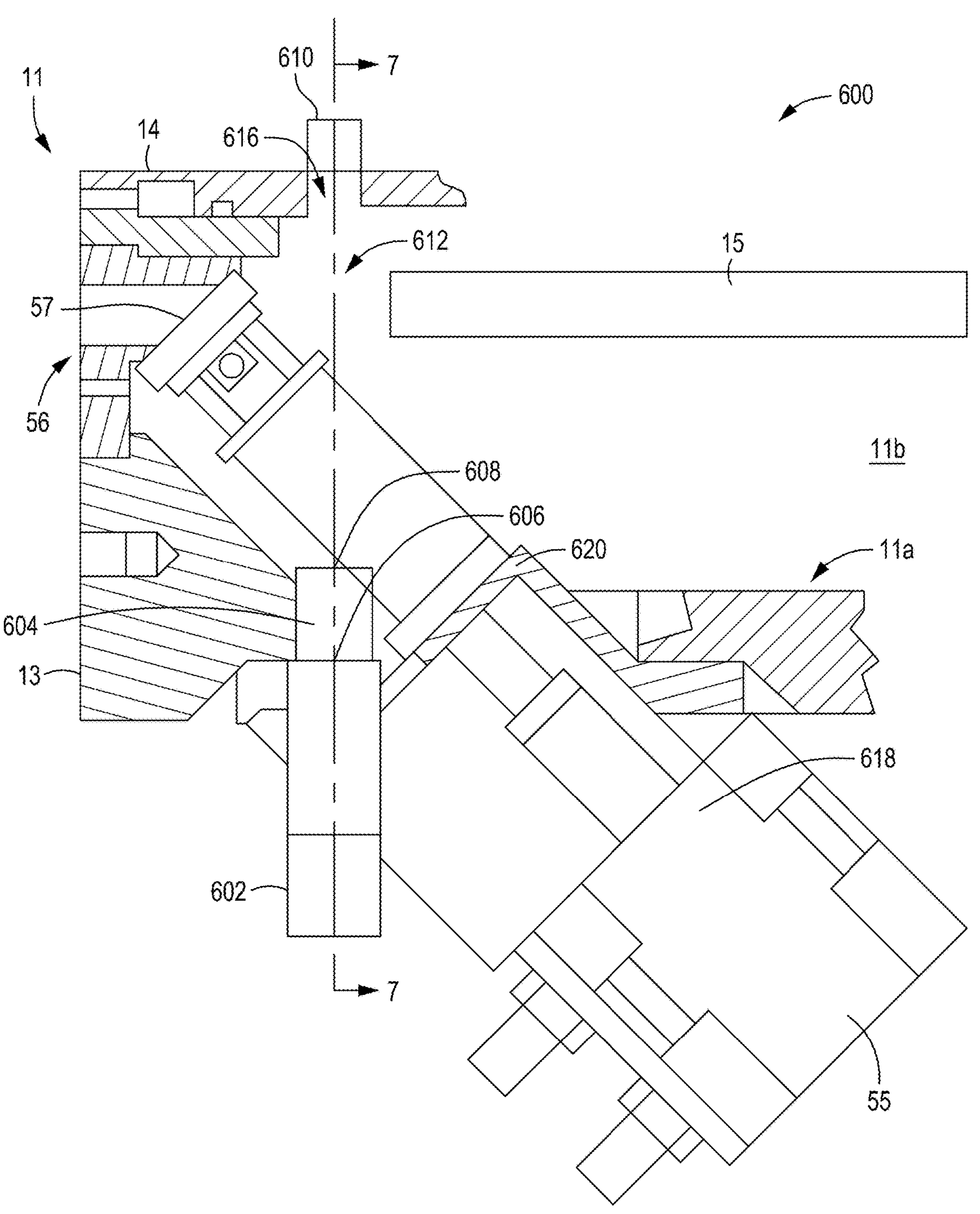
FIG. 6 is a section view of the slit valve and load lock chamber shown in FIG. 2 in accordance with some embodiments of the present disclosure.

In some embodiments, and referring to FIGS. 4, 5 and 6, a plurality of coordinate positions (seven coordinate positions denoted $x_1$-$x_7$ are shown in FIGS. 4 and 6) may be used for calculating a substrate center coordinate: a robot blade reference position and six substrate positions. The seven coordinate positions may be defined as the substrate transfer blade 31 is withdrawn from the external cassette elevator 18 parallel to the x axis, thereby moving the substrate transfer blade 31 and substrate 15 through the light beams 67, 68, and 69 and sequentially blocking/unblocking the sensors 64, 65, and 66 corresponding to the locations of the light outputs of light guides 61*b*, 62*b*, and 63*b*.

Referring to FIGS. 4-6, a first coordinate, x1, may be determined by the leading edge of substrate blade slot 74 (FIG. 5). That is, sensor 65 is unblocked and a resulting "1" signal may be sent to the controller 25, as the leading edge of substrate 15 traverses the light beam 68. Upon continued movement of the substrate transfer blade 31 along the x axis toward and into the load lock chamber 11, the sensors 65, 64, and 66 may be sequentially blocked by the leading edge of the moving substrate 15, changing the associated input signal to the controller 25 from "1" to "0" to provide the associated extension position of motor 53 and motor 51 for storage in memory of the controller 25 as respective positions x2, x3 and x4. Conversely, as the substrate 15 completes its traverse of the light beams 67, 68, and 69, the sensors 64, 66, and 65 may be sequentially unblocked, changing the associated input signal to the controller 25 from "0" to "1" to provide the associated extension position of motor 53 and motor 51 for storage in memory of the controller 25 as respective positions x5, x6 and x7.

The sequence of blocking and unblocking sensors 64, 65, and 66 indicated in the example described above with reference to FIGS. 4-6 may not be repeated in all instances and is merely exemplary. That is, for example, x4 may be located closer to x1 along the x direction than is x3 (for example, because a substrate flat is located at x3 or simply because of variations in the position of the substrate on the substrate transfer blade 31), with the result that x4 is detected prior to x3. Similarly, x7 may be closer to x1 than is x5 (again, because of the orientation of the substrate or because a substrate flat coincides with and determines the position x7).

The x1-x7 positions which are represented by associated stepper motor steps, may be converted by the controller 25 from motor extension steps to x coordinates. The x1 coordinate associated with the substrate transfer blade 31 may be used for the purpose of setting up the origin of the coordinate system (intersection of x and y axes). In some embodiments, after the preliminary steps of determining the motor extension positions x1 through x7, and converting the position to x coordinates, the six substrate x coordinates x2-x7 may be used in the algorithms described in co-owned U.S. Pat. No. 4,819,167 entitled SYSTEM AND METHOD FOR DETECTING THE CENTER OF AN INTEGRATED CIRCUIT WAFER, which is incorporated herein, to determine the center coordinate of the substrate 15.

Figure 7:
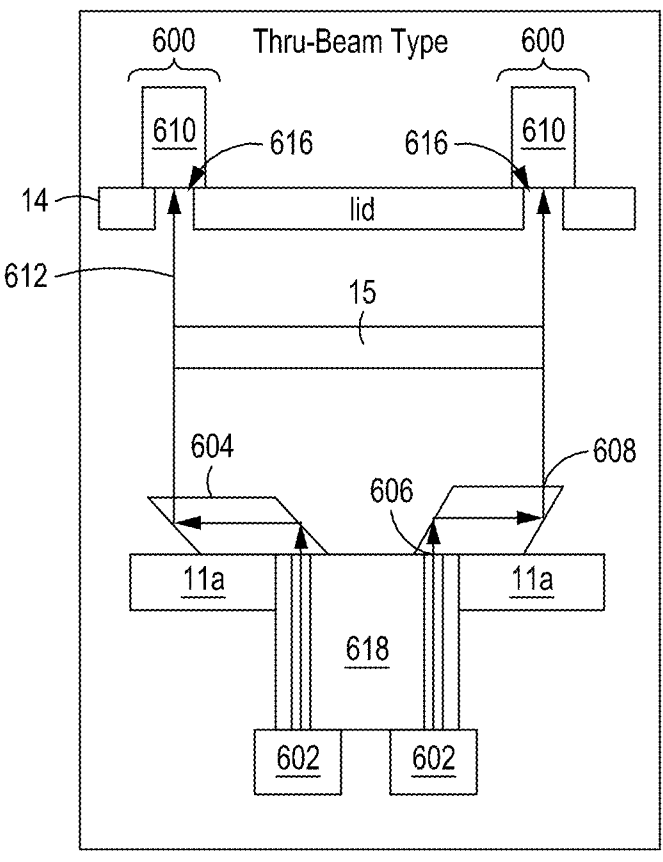
FIG. 7 is a view of the sensor system shown in FIG. 6 along section 7-7 shown in FIG. 6.

FIGS. 6 and 7 show an embodiment of a sensor system 600 in accordance with some embodiments of the disclosure. In some embodiments, and as shown in FIGS. 2 and 6, the slit valve opening 56 may be closed by a slit valve door 57 of a slit valve 55. The slit valve 55 may be fixed to at least one of the base 11*a* (as shown in FIGS. 6 and 7) or the chamber wall 13 of the load lock chamber 11. In some embodiments, and as shown in FIGS. 6 and 7, the sensor system 600 may include a light source 602 configured to generate light in the load lock chamber 11. In some embodiments, the light source 602 may include a laser or a light emitting diode (LED). In some embodiments, and as shown in FIG. 6, the light source 602 may be fixed to a mounting frame 620 of the slit valve 55. In some embodiments, the mounting frame 620 may mount to at least one of the base 11*a* or the chamber wall 13 of the load lock chamber 11. The sensor system 600 may include a light guide 604 fixed relative to the light source 602 and having a light input 606 and a light output 608 offset from the light input 606. In some embodiments, and as shown in FIGS. 6 and 7, the light guide 604 may be spaced (e.g., vertically) from the light source 602 by a portion 618 (e.g., a seat) of the slit valve 55. The light input 606 may be configured to receive light generated by the light source 601. The light guide 604 may have an internal structure (e.g., crystal prism) that internally reflects light between the light input 606 and the light output 608. In some embodiments, the light guide 604 may be fabricated from at least one of polycarbonate, glass, or quartz.

In some embodiments, and as shown in FIGS. 6 and 7, a light beam 612 may be emitted from the light output 608. The sensor system 600 may include a sensor 610 configured to sense the light beam 612 emitted from the light output 608. In some embodiments, and as shown in FIGS. 6 and 7, a lid 14 of the load lock chamber 11 may have a hole 616 to allow the light beam 612 to pass to sensor 610, which may be mounted in or over the hole 616 of the lid 14. By placing the sensor 610 in the lid 14, even if the lid 14 is removed and replaced, it is not necessary to recalibrate the sensor system 600 because the precise location of the light output 608, and thus the light beam 612, is not altered by removing and replacing the lid 14.

Also, as shown in FIG. 7, by offsetting the light input 606 from the light output 608, the light beam 612 may be located at any desired coordinate in the load lock chamber 11, even if there is not a direct line of sight between the light source 602 and the sensor 610. Since the sensor 610 may be located in an offset configuration relative to the light source 601, the location of the light output 608 may be used as a reference coordinate for measuring position data of the substrate 15 in the load lock chamber 11.

In some embodiments, and as shown in FIG. 7, a plurality of sensor systems 600 (two sensor systems 600 are shown) may be used to generate a plurality of light beams 612 (2 are shown), similar to the multiple light beams 67, 68, and 69 of sensor systems 60 described above. Also, like the sensor systems 60, the light outputs 608 of the light guides 604 may be arranged along an axis that is perpendicular to a direction of movement of the substrate 15.

In some embodiments, and as shown in FIG. 7, the light guides 604 may be selected and installed based on the dimensions (e.g., width) of the substrate 15. In some embodiments, the offset between the light input 606 and the light output 608 may be chosen based on the dimensions of the substrate 15 to be detected. In some embodiments, and as shown in FIG. 7, the offset between the light input 606 and the light output 608 may be selected so that the spacing between the light outputs 608 of neighboring sensor systems 600 is less than or equal to a width (or diameter) of the substrate 15 being measured so that the light beams 612 emitted by the light outputs 608 can be crossed by the substrate 15 to block and unblock the sensors 610.

In some embodiments, as the substrate 15 crosses the light beams 612, the sensors 610 corresponding to the light beams 612 may be sequentially blocked by the leading edge of the moving substrate 15, changing the associated input signal to the controller 25 from "1" to "0" to provide the associated extension position of motor 53 and motor 51 for storage in memory of controller 25. The sensors 610 may be sequentially unblocked by the trailing edge of the moving substrate 15, changing the associated input signal to the controller 25 from "0" to "1" to provide the associated extension position of motors 53 and 56 for storage in memory of controller 25. The recorded positions of the light outputs 608 corresponding to the light beams 612 may be used to calculate a center of the substrate 15 as described above.

Figure 8:
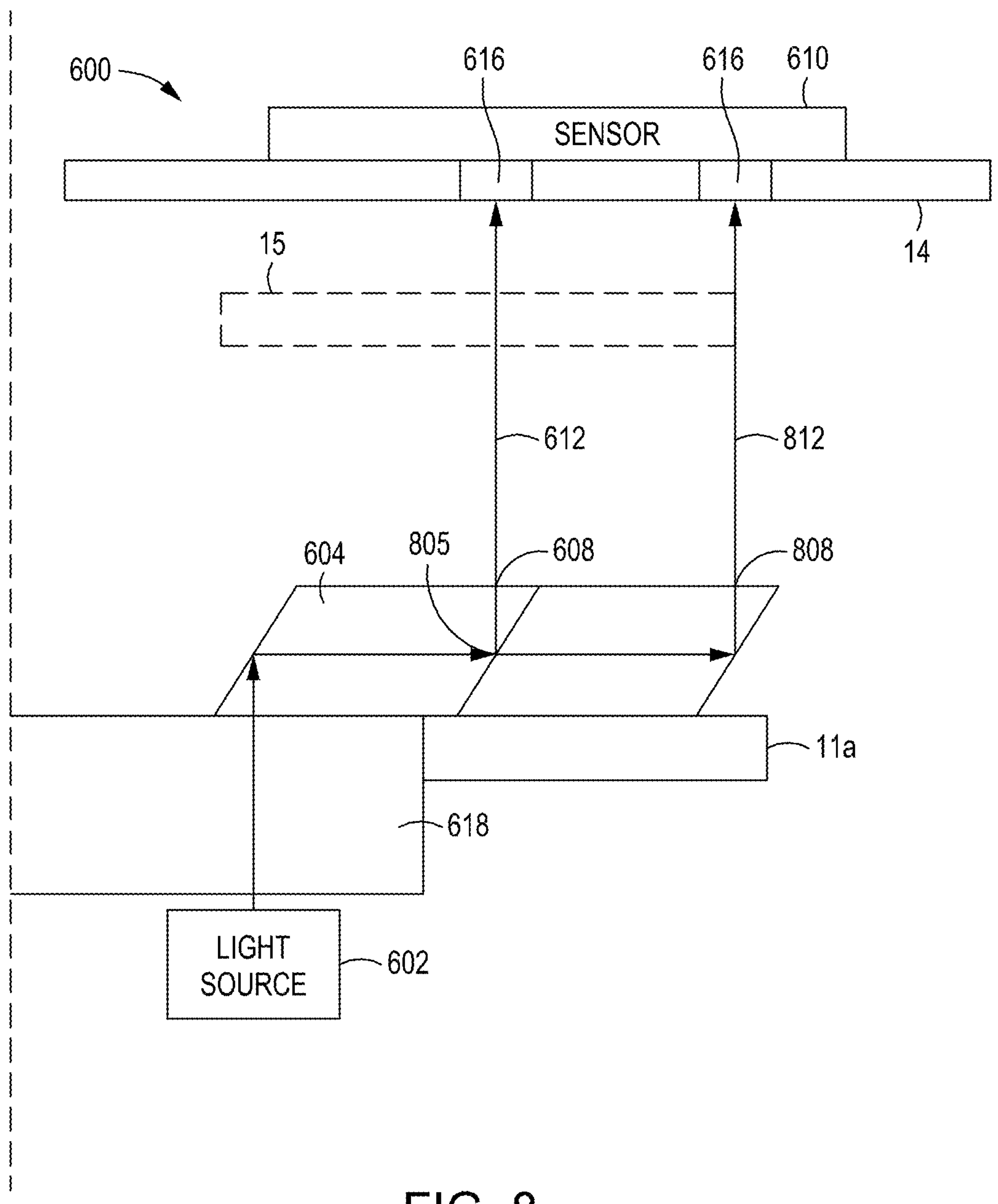
FIG. 8 shows the sensor system shown in FIG. 7 using a light guide with a plurality of light outputs in accordance with some embodiments of the present disclosure.

In some embodiments, and as shown in FIG. 8, the light guide 604 may include a beam splitter 805 configured to split light received by the light guide 604 and direct a portion of the light to light output 608 and to a light output 808 of the light guide 604. The light outputs 608 and 808 may be offset from one another and configured to emit corresponding light beams 612 and 812 in parallel directions, e.g., toward the sensor 610. While a single sensor 610 is shown in FIG. 8, in some embodiments, multiple sensors 610 corresponding to each light output 608 and 808 may be used.

Figure 9:
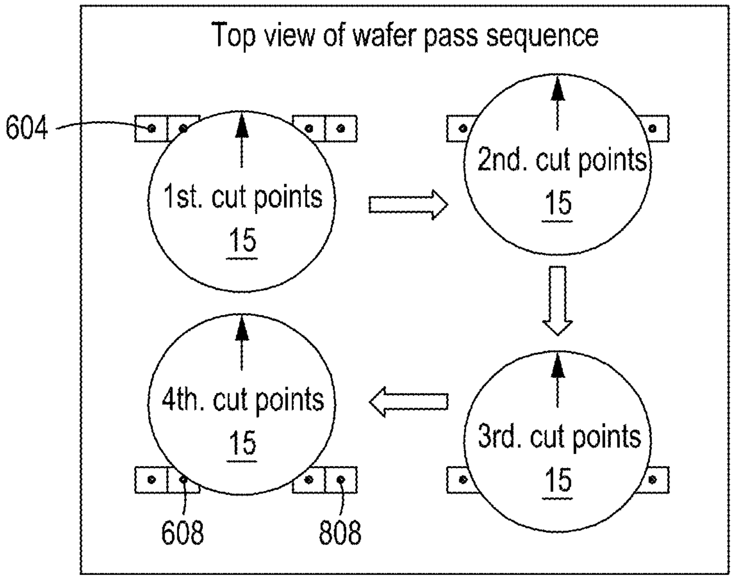
FIG. 9 shows a sequence of a substrate moving along a pathway through the sensor system shown in FIG. 8 in accordance with some embodiments of the present disclosure.

FIG. 9 shows the sensor systems 600 in FIG. 8 as the substrate 15 passes through the light beams 612 and 812. In some embodiments, and as shown in FIG. 9, the plurality of light outputs 608 and 808 may be arranged along a common axis, which may be perpendicular to a direction of movement of the substrate 15 (shown by arrows overlaid on substrate 15). As the substrate 15 moves, sensors 610 are blocked and unblocked in a sequence recorded by the controller 25 and used calculate a center of the substrate 15 using the techniques as described herein. Increasing the number of light outputs from two light outputs 608, as shown in FIG. 7, to four light outputs 608 and 812, as shown in FIGS. 8 and 9, allows the substrate 15 to block and unblock the sensors 610 four times instead of two times, thereby collecting eight data points instead of four data points, which can improve accuracy of calculating the location of the center of the substrate 15, especially if the substrate has a cut flat/notch edge.

Figure 10:
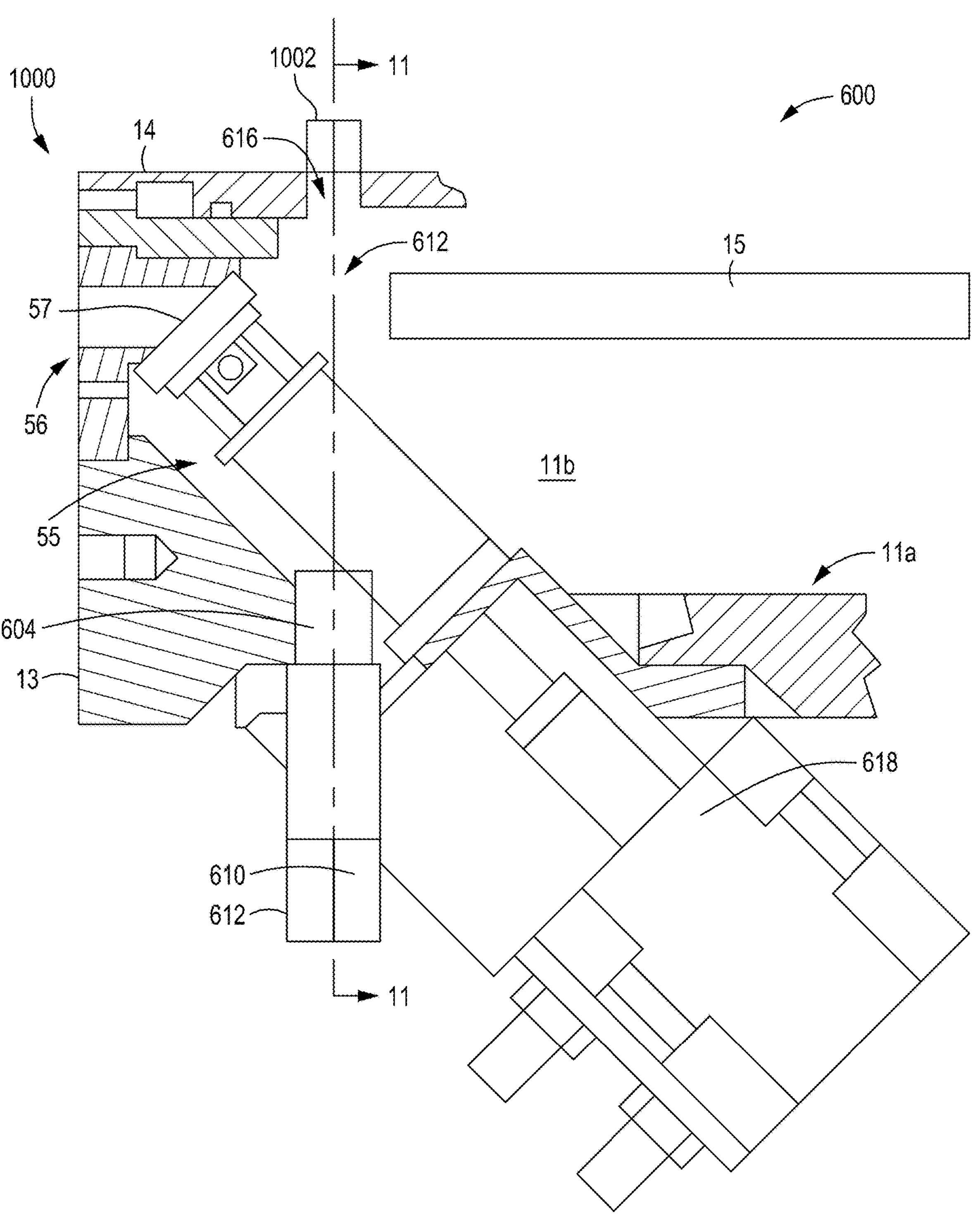
FIG. 10 is a section view of the slit valve and load lock chamber shown in FIG. 2 in accordance with some embodiments of the present disclosure.
Figure 11:
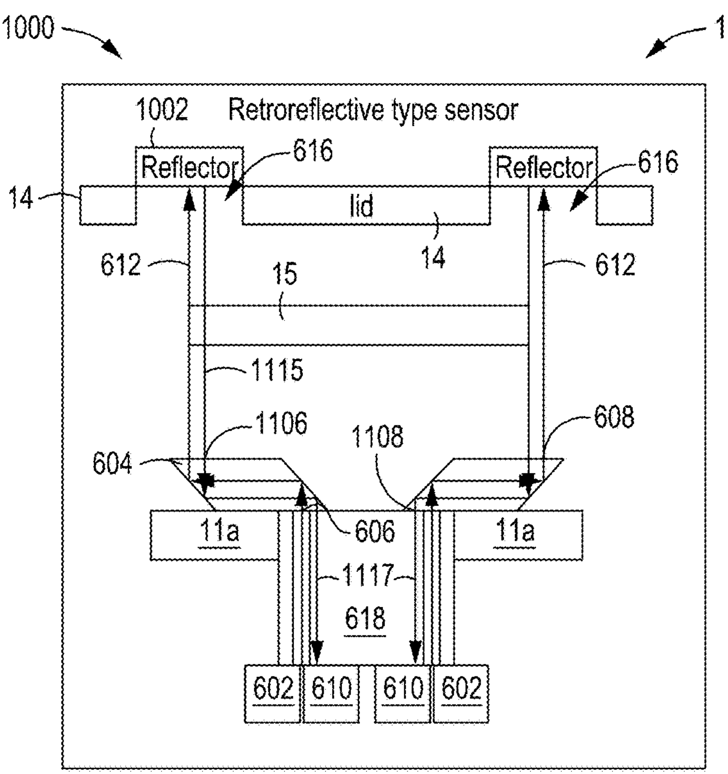
FIG. 11 is a view of the sensor system shown in FIG. 10 along section 11-11 shown in FIG. 10.

FIGS. 10 and 11 show a sensor system 1000 in accordance with some embodiments of the present disclosure. In some embodiments, and as shown in FIGS. 10 and 11, the sensor system 1000 may include the components of the sensor system 600 arranged in a modified configuration along with a reflector 1002. In some embodiments, and as shown in FIGS. 10 and 11 the reflector 1002 is located in or above the hole 616 in the lid 14 and the sensor 610 is located opposite the sensor 610 below the base 11*a* of the load lock chamber 11. In some embodiments, the sensor 610 may be located adjacent to the light source 602.

In some embodiments, and as shown in FIG. 11, the light guide 604 may include a plurality of light inputs 606 and 1106 and plurality of light outputs 608 and 1108 that partially define a light path through the light guide 604. In the embodiment shown in FIG. 11, light emitted by the light source 602 may be received at a first light input 606, which may be internally reflected and emitted at the first light output 608. The light emitted at the first light output 608 is shown as light beam 612 directed toward the reflector 1002. The reflector 1002 may be configured to receive and reflect the light beam 612 toward the sensor 610. Specifically, a reflected light beam 1115 is received at a second light input 1106. The received light beam 1115 may be internally reflected within the light guide 604 and then emitted as light beam 1117 at a second light output 1108 toward the sensor 610. As shown in FIG. 11, a plurality of sensor systems 1000 may be used to emit a plurality of light beams 615, 1115 arranged along an axis perpendicular to a path of motion of the substrate 15. A center of the substrate 15 may be determined using the techniques described above that may use coordinates recorded during a sequence of blocking and unblocking the sensors 610 as the substrate 15 passes across the light beams 615, 1115.

Figure 12:
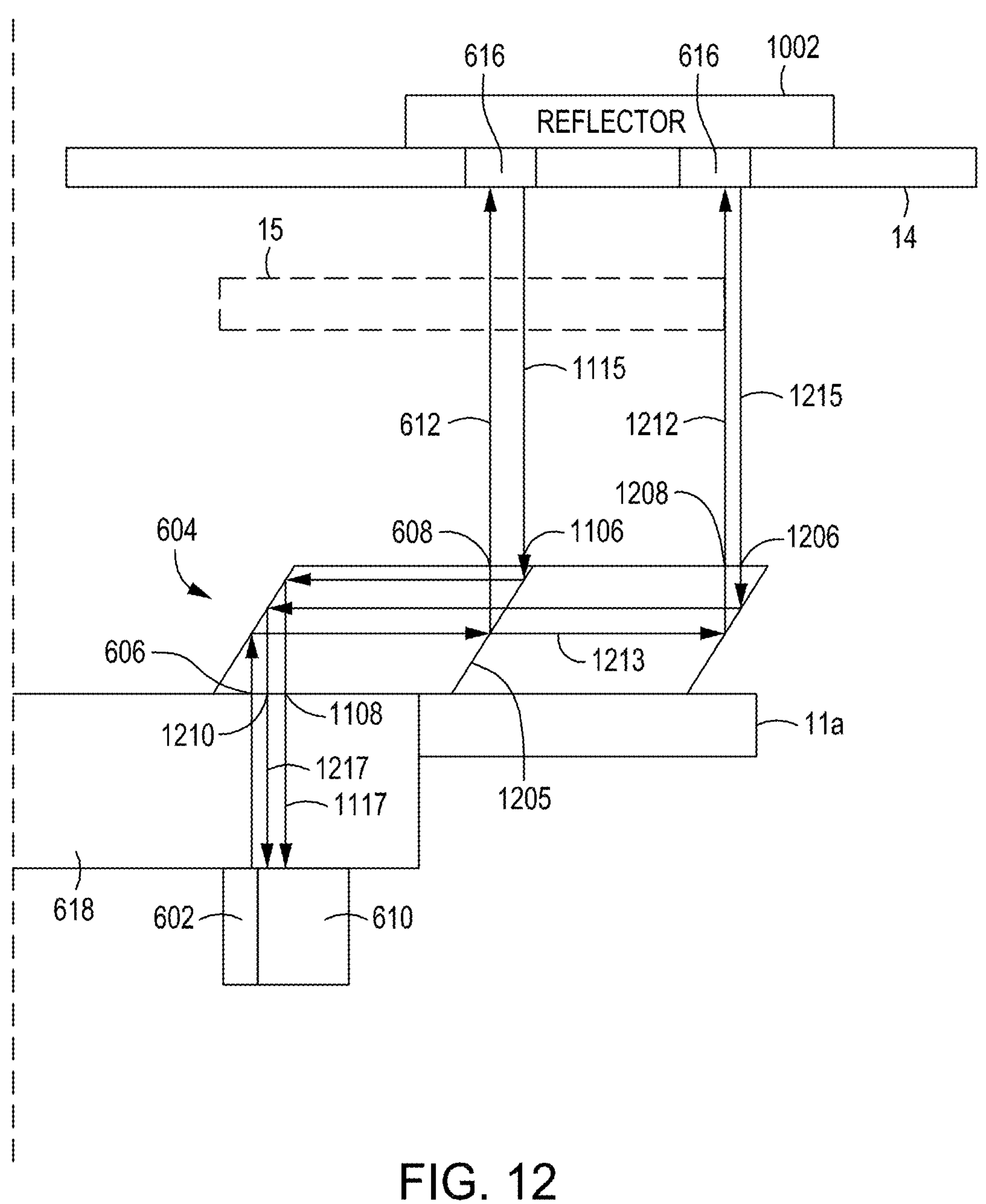
FIG. 12 shows the sensor system shown in FIG. 11 using a light guide with a plurality of light outputs in accordance with some embodiments of the present disclosure.

In some embodiments, and as shown in FIG. 12, the light guide 604 shown in FIG. 11 may be modified to have an additional light output 1208 and light input 1206 to direct additional light beams 1212 and 1215 between the reflector 1002 and the light guide 604, and may have an additional light output 1210 to emit light received from light beam 1215 as light beam 1217 between the light guide 604 and the sensor 610. In some embodiments, and as shown in FIG. 12, the light outputs 608 and 1208 may be offset from one another and configured to emit corresponding light beams 612 and 1212 in parallel directions toward the reflector 1002. The light guide 604 may include a beam splitter 1205 configured to split light received by the light guide 604 and direct a portion of the light to light output 608 and a portion 1213 to light output 1208 of the light guide 604.

A center of the substrate 15 shown in FIG. 12 may be determined using the techniques described above that may use coordinates recorded during a sequence of blocking and unblocking the sensors 610 as the substrate 15 passes across the light beams 1115, 1215.

Figure 13:
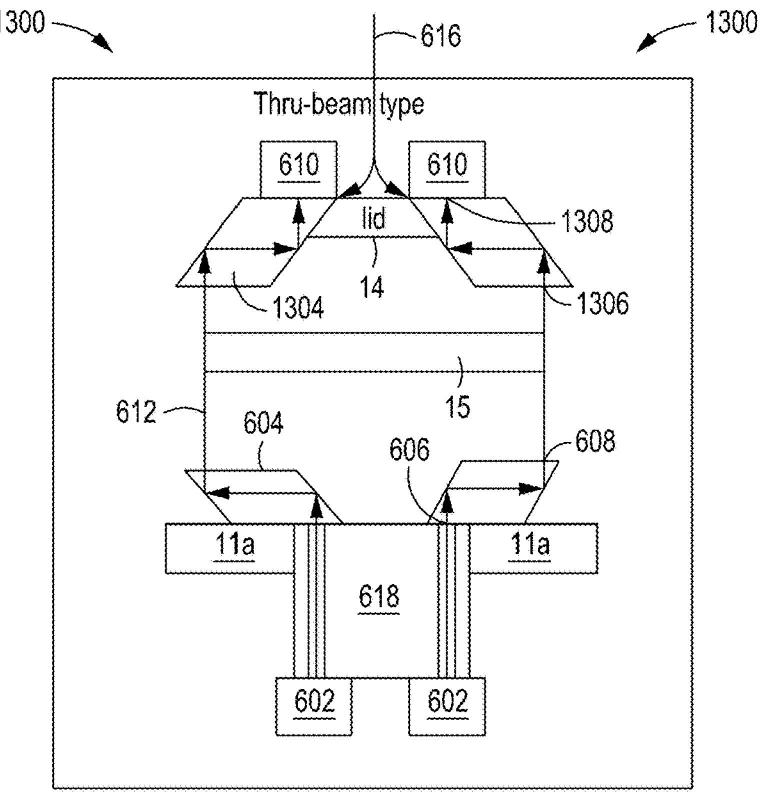
FIG. 13 shows another sensor system in accordance with some embodiments of the present disclosure.

FIG. 13 shows sensor systems 1300 in accordance with some embodiments of the present disclosure. In some embodiments, and as shown in FIG. 13, each sensor system 1300 may include the components of sensor system 600 shown in FIGS. 6 and 7 along with an additional light guide 1304 located in or on the lid 14. In addition, as shown in FIG. 13, each hole 616 in the lid 14 is horizontally offset from the light output 608 of the light guide 604. Each light guide 1304 (e.g., a second light guide) may be positioned along an optical path (represented by arrows in FIG. 13) between the light guide 604 (e.g., a first light guide) and the sensor 610. Each light guide 1304 is used to route light beam 612 through the hole 616 and to the sensor 610. Specifically, each light guide 1304 includes a light input 1306 and a light output 1308 and has an internal structure configured to internally reflect light between the light input 1306 and the light output 1308. In some embodiments, and a shown in FIG. 13, the light beam 612 is received at the light input 1306 and is internally reflected within the light guide 1304 and emitted at the light output 1308 toward the sensor 610. The sensor systems 1300 shown in FIG. 13 may provide additional flexibility in locating the sensors 610 at a location that is not in line of sight with the light outputs 608 of the light guides 604. A center of the substrate 15 shown in FIG. 13 may be determined by passing the substrate 15 across the light beams 612 to block and unblock the sensors 610 as described above. A center of the substrate 15 shown in FIG. 13 may be determined using the techniques described above that may use coordinates recorded during a sequence of blocking and unblocking the sensors 610 as the substrate 15 passes across the light beams 612.

Figure 14:
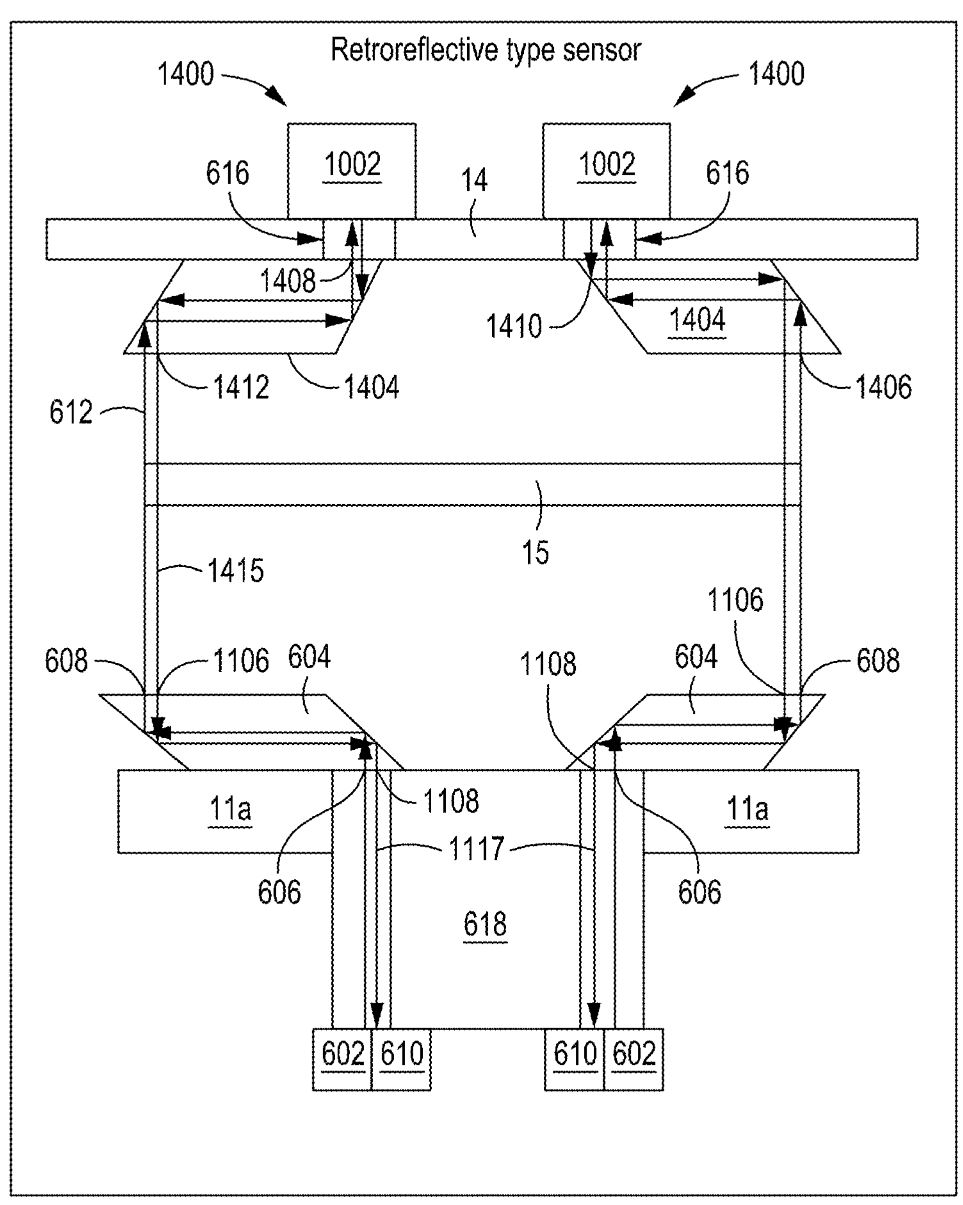
FIG. 14 shows another sensor system in accordance with some embodiments of the present disclosure.

FIG. 14 shows sensor systems 1400 in accordance with some embodiments of the present disclosure. In some embodiments, and as shown in FIG. 14, each sensor system 1400 may include the components of sensor system 1000 shown in FIGS. 10 and 11 along with an additional light guide 1404 located in or on the lid 14. In addition, as shown in FIG. 14, each hole 616 in the lid 14 is horizontally offset from the light output 608 of the light guide 604. Each light guide 1404 (e.g., a second light guide) may be positioned along an optical path (represented by arrows in FIG. 14) between the light guide 604 (e.g., a first light guide) and the sensor 610. Each light guide 1404 is used to route light beam 612 through the hole 616 and to the reflector 1002 and to route a reflected light beam 1415 back to the sensor 610. Specifically, each light guide 1404 includes light inputs 1406 and 1410 and light outputs 1408 and 1412. Each light guide 1404 has an internal structure configured to internally reflect light between the light input 1406 and light output 1408 and between light input 1410 and light output 1412. In some embodiments, and a shown in FIG. 14, the light beam 612 is received at the light input 1406 and is internally reflected within the light guide 1404 and emitted at the light output 1408 toward the reflector 1002. The reflector 1002 reflects a light beam 1415 that is received at light input 1410 and is internally reflected within the light guide 1404 and emitted at the light output 1412 towards the light guide 604. The light guide 604 receives light beam 1415 at the light input 1106 and the light guide 604 internally reflects the light beam 1415 and emits light beam 1117 at light output 1108 toward sensor 610. The sensor systems 1400 shown in FIG. 14 may provide additional flexibility in locating the sensors 610 at a location that is not in line of sight with the light outputs 608 of the light guides 604. A center of the substrate 15 shown in FIG. 14 may be determined by passing the substrate 15 across the light beams 612 and 1415 to block and unblock the sensors 610 as described above. A center of the substrate 15 shown in FIG. 14 may be determined using the techniques described above that may use coordinates recorded during a sequence of blocking and unblocking the sensors 610 as the substrate 15 passes across the light beams 612 and 1415.

As described herein, even in cases where chamber geometry is complex or a direct view to an edge of a substrate not available due to lack of view port on the chamber body, the embodiments described herein provide sensor systems and methods to view and detect the edge of a substrate by using light guides. Also, the systems and methods are adaptable to measure multiple sizes of substrates by installing a suitable light guide for each size.

While the foregoing is directed to embodiments of the present disclosure, other and further embodiments of the disclosure may be devised without departing from the basic scope thereof.

The invention claimed is:

1. A substrate processing system comprising:

a chamber having an interior volume; and a sensor system coupled to the chamber, the sensor system comprising:

a light source configured to generate light;

a first light guide and a second light guide fixed relative to the light source, the first light guide and the second light guide each having a light input and a light output offset from the light input, the light input configured to receive light generated by the light source, wherein each of the first light guide and the second light guide guides the light between the respective light input and the light output so that the light output emits a light beam into the interior volume of the chamber;

a first sensor configured to sense the light beam emitted from the light output of the first light guide; and a second sensor configured to sense the light beam emitted from the light output of the second light guide, wherein the light output of the first light guide and the light output of the second light guide are arranged along a common axis and configured to emit light in parallel directions.

2. The substrate processing system of claim 1, further comprising a controller to determine a center of a substrate based on an output of the sensor.

3. The substrate processing system of claim 1, further comprising a reflector spaced from the first light guide and configured to receive and reflect the light beam towards the sensor.

4. The substrate processing system of claim 1, further comprising a second light guide on a lid of the chamber, wherein the second light guide is positioned on an optical path between the first light guide and the sensor.

5. The substrate processing system of claim 1, wherein the first light guide is comprised of at least one of polycarbonate, glass, or quartz.

6. The substrate processing system of claim 1, wherein the light is received at the light input along a first direction and the light emitted at the light output is emitted along a second direction different from the first direction.

7. The substrate processing system of claim 1, wherein the first light guide and the second light guide includes a plurality of light outputs offset from one another and configured to emit light in parallel directions, wherein the plurality of light outputs are arranged along the common axis.

8. The substrate processing system of claim 1, further comprising a robot arm configured for supporting a substrate horizontally along a path of movement within the interior volume that is coincident with an optical path between the first light guide and the sensor for triggering the sensor.

9. The substrate processing system of claim 1, wherein the chamber includes a wall that includes a slit valve opening being located along the path of movement, and further comprising a slit valve door selectively opening and closing the slit valve opening.

10. The substrate processing system of claim 9, wherein the first light guide is fixed to the slit valve within the interior volume of the chamber.

11. The substrate processing system of claim 9, further comprising a mounting frame for mounting the slit valve to at least one of the wall or a base of the chamber, wherein the light source is fixed to the mounting frame.

12. A sensor system for detecting a substrate in a chamber of a substrate processing system, the sensor system comprising:

a light source configured to generate light;

a first light guide and a second light guide fixed relative to the light source, the first light guide and the second light guide each having a light input and a light output offset from the light input, the light input configured to receive light generated by the light source, wherein each of the first light guide and the second light guide guides the light between the respective light input and the light output so that the light output emits a light beam into a volume of the chamber;

a first sensor configured to sense the light beam emitted from the light output of the first light guide; and a second sensor configured to sense the light beam emitted from the light output of the second light guide, wherein the light outputs of the first light guide and the second light guide are arranged along a common axis and configured to emit light in parallel directions.

13. The substrate processing system of claim 12, wherein the light source includes at least one of a light emitting diode or a laser.

14. The sensor system of claim 12, further comprising a reflector spaced from the first light guide and configured to receive and reflect the light beam towards the sensor.

15. The sensor system of claim 12, wherein the first light guide is comprised of at least one of polycarbonate, glass, or quartz.

16. The sensor system of claim 12, wherein the first light guide and the second light guide includes a plurality of light outputs offset from one another and configured to emit light in parallel directions, and wherein the plurality of light outputs are arranged along the common axis.

17. The sensor system of claim 16, further comprising a beam splitter between the plurality of light outputs, wherein the beam splitter is configured to split the light generated by the light source into a portion of light for each of the plurality of light outputs.

18. A method for detecting a substrate in a chamber of a substrate processing system, the method comprising:

generating an array of light beams within the chamber transverse to a path of movement of the substrate within the chamber, wherein the array of light beams is generated by one or more sensor system comprising:

a light source configured to generate light;

a first light guide and a second light guide fixed relative to the light source the first light guide and the second light guide each having a light input and a light output offset from the light input, the light input configured to receive light generated by the light source, wherein each of the first light guide and the second light guide guides the light between the respective light input and the light output so that the light output emits a light beam into a volume of the chamber;

a first sensor configured to sense the light beam emitted from the light output of the first light guide; and a second sensor configured to sense the light beam emitted from the light output of the second light guide, wherein the light outputs of the first light guide and the second light guide are arranged along a common axis and configured to emit light in parallel directions;

moving the substrate along the path such that leading and trailing edges of the substrate trigger the sensor to thereby generate associated sensor outputs that represent positions associated with the light outputs along the path of movement; and determining a center of the substrate based on the sensor outputs.

19. The method of claim 18, wherein the first light guide includes a plurality of light outputs offset from one another and configured to emit light in parallel directions, and wherein the array of light beams includes light beams output from the plurality of light outputs.

20. The method of claim 18, wherein the sensor system further includes a reflector spaced from the first light guide and configured to receive and reflect a light beam of the array of light beams towards the sensor.

* * * * *